United States Patent
Wu et al.

(10) Patent No.: US 9,560,752 B2
(45) Date of Patent: Jan. 31, 2017

(54) PRINTED CIRCUIT BOARD HAVING IMPROVED CHARACTERISTIC IMPEDANCE

(71) Applicant: HON HAI PRECISION INDUSTRY CO., LTD., New Taipei (TW)

(72) Inventors: Jerry Wu, Irvine, CA (US); Jun Chen, Kunshan (CN); Fan-Bo Meng, Kunshan (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 440 days.

(21) Appl. No.: 14/261,749

(22) Filed: Apr. 25, 2014

(65) Prior Publication Data

US 2014/0322984 A1    Oct. 30, 2014

(30) Foreign Application Priority Data

Apr. 26, 2013    (CN) .......................... 2013 1 01497182

(51) Int. Cl.
| | |
|---|---|
| H05K 1/00 | (2006.01) |
| H05K 1/09 | (2006.01) |
| H05K 1/03 | (2006.01) |
| H01R 24/00 | (2011.01) |
| H05K 1/02 | (2006.01) |
| H01R 13/66 | (2006.01) |
| H01R 24/62 | (2011.01) |
| H05K 1/11 | (2006.01) |
| H05K 3/34 | (2006.01) |

(52) U.S. Cl.
CPC ........ *H05K 1/0298* (2013.01); *H01R 13/6658* (2013.01); *H05K 1/025* (2013.01); *H05K 1/0242* (2013.01); *H01R 24/62* (2013.01); *H05K 1/0245* (2013.01); *H05K 1/111* (2013.01); *H05K 1/117* (2013.01); *H05K 3/341* (2013.01); *H05K 2201/09736* (2013.01); *H05K 2201/10356* (2013.01)

(58) Field of Classification Search
CPC .. H05K 1/0298; H05K 1/0242; H05K 1/0245; H05K 1/025; H05K 1/111; H05K 1/117; H05K 2201/09736
USPC ................... 174/250, 251, 255, 257; 439/660
See application file for complete search history.

(56) References Cited

U.S. PATENT DOCUMENTS

| | | |
|---|---|---|
| 7,088,200 B2 | 8/2006 | Bartley et al. |
| 8,692,128 B2 | 4/2014 | Su et al. |
| 2009/0017697 A1* | 1/2009 | Zhu .................... H01R 13/6473 439/682 |

(Continued)

*Primary Examiner* — Sherman Ng
(74) *Attorney, Agent, or Firm* — Wei Te Chung; Ming Chieh Chang (57) ABSTRACT

An printed circuit board (14) includes a first insulative layer (140), a first conductive path (141), a second conductive path (142) and an insulative substrate (143) stacked together. The first conductive path is disposed between the insulative substrate and the first insulative layer. The first conductive path includes an engaging portion (146), a middle portion (148) having an end connected with the engaging portion, and a soldering portion (147) connected with an opposite end of the middle portion. The second conductive path is aligned with the middle portion of the first conductive path along a vertical direction, the second conductive path electrically connected with the middle portion of the first conductive path to increase a thickness thereon.

13 Claims, 8 Drawing Sheets

(56) References Cited

U.S. PATENT DOCUMENTS

2012/0111626 A1\* 5/2012 Su .................. H05K 1/0225
174/267

\* cited by examiner

PRINTED CIRCUIT BOARD HAVING IMPROVED CHARACTERISTIC IMPEDANCE

BACKGROUND OF THE INVENTION

1. Field of the Invention

The present invention relates to a printed circuit board, and more particularly to a printed circuit board of an electrical connector with high speed signal transmission 2. Description of Prior Arts A conventional printed circuit board comprises plural conductive paths. The printed circuit board could be received in an electrical connector with high speed signal transmission. The conductive path comprises a soldering portion, an engaging portion, and a middle portion interconnected between the soldering portion and the engaging portion. The soldering portion is used for being soldered with a wire. The engaging portion is used for being mated with a mating terminal. When the engaging portion of the conductive path is mated with a mating portion of the mating terminal, a combined thickness of the mating portion and the engaging portion will be greater than a thickness of the middle portion. Likewise, when the soldering portion of the conductive path is soldered with a conductor of the wire, a combined thickness of the soldering portion and the conductor will be greater than a thickness of the middle portion. Therefore, when the electrical connector assembly is working, the characteristic impedance of the printed circuit board will have a discontinuity. That is, the characteristic impedance of the engaging portion is smaller than the characteristic impedance of the middle portion, and the characteristic impedance of the soldering portion is smaller than the characteristic impedance of the middle portion. This makes the transmission of the high speed signals unstable.

U.S. Pat. No. 7,088,200, issued to Bartley et al. on Aug. 8, 2006, discloses a method and structure to control common mode impedance in fan-out regions for printed circuit board applications. A differential pair transmission line includes a narrow signal trace portion in the fan-out region and a wider signal trace portion outside of the fan-out region. The narrow signal trace portion in the fan-out region has an increased thickness relative to the wider signal trace portion.

A printed circuit board with stable signal transmission is desired.

SUMMARY OF THE INVENTION

A printed circuit board comprises a first insulative layer, a first conductive path, a second conductive path, and an insulative substrate stacked together. The first conductive path is disposed between the insulative substrate and the first insulative layer. The first conductive path comprises an engaging portion, a middle portion having an end connected with the engaging portion, and a soldering portion connected with an opposite end of the middle portion. The second conductive path is aligned with the middle portion of the first conductive path along a vertical direction, the second conductive path electrically connected with the middle portion of the first conductive path to increase a thickness thereon.

Other advantages and novel features of the invention will become more apparent from the following detailed description of the present embodiment when taken in conjunction with the accompanying drawings.

DETAILED DESCRIPTION OF THE PREFERRED EMBODIMENT

Reference will now be made to the drawing figures to describe the present invention in detail.

Figure 1:
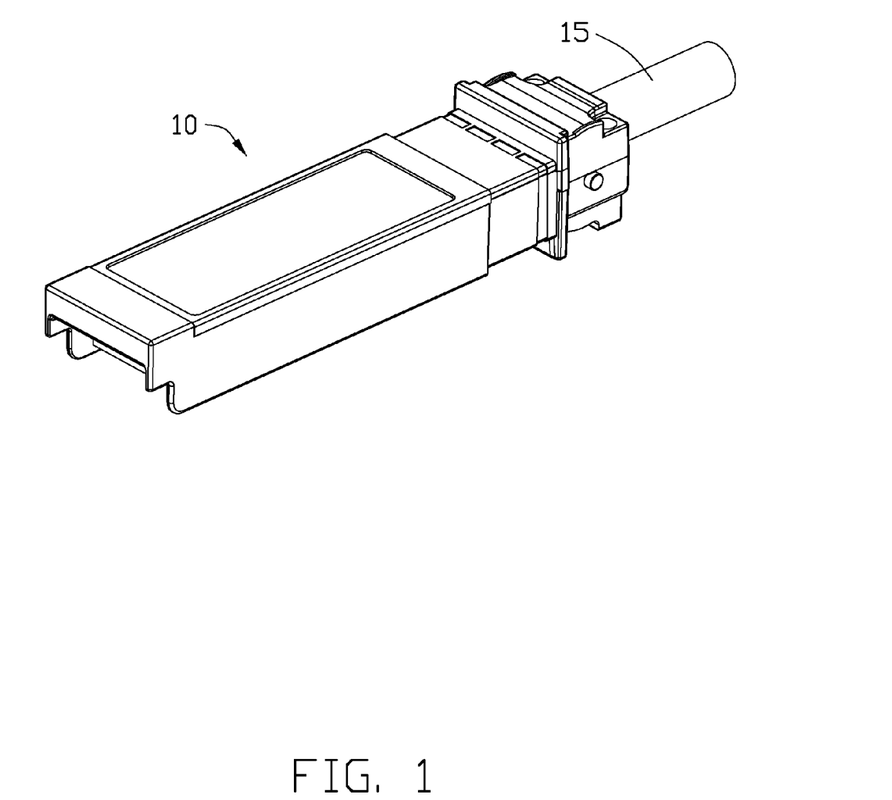
FIG. 1 is a perspective view of an electrical connector assembly having a printed circuit board in accordance with the present invention.
Figure 2:
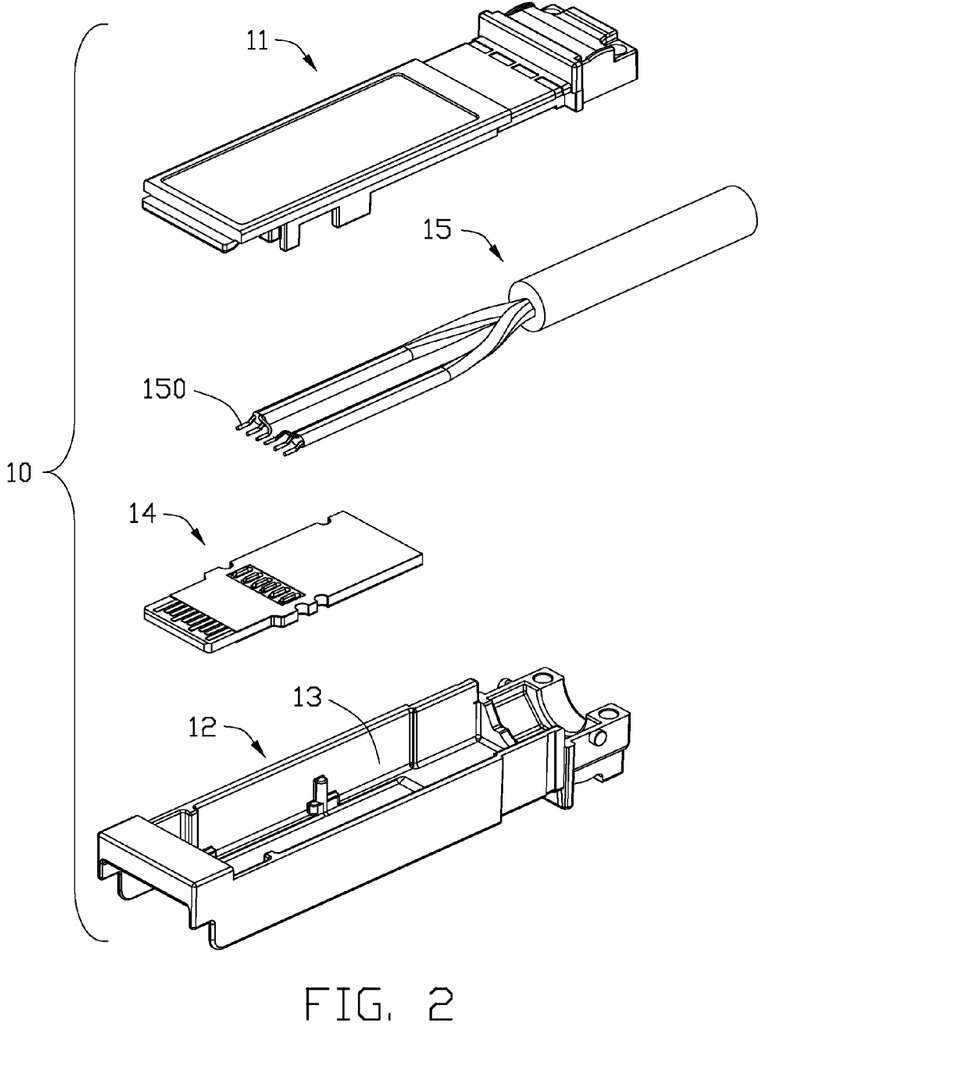
FIG. 2 is an exploded view of the electrical connector assembly as shown in FIG. 1.
Figure 3:
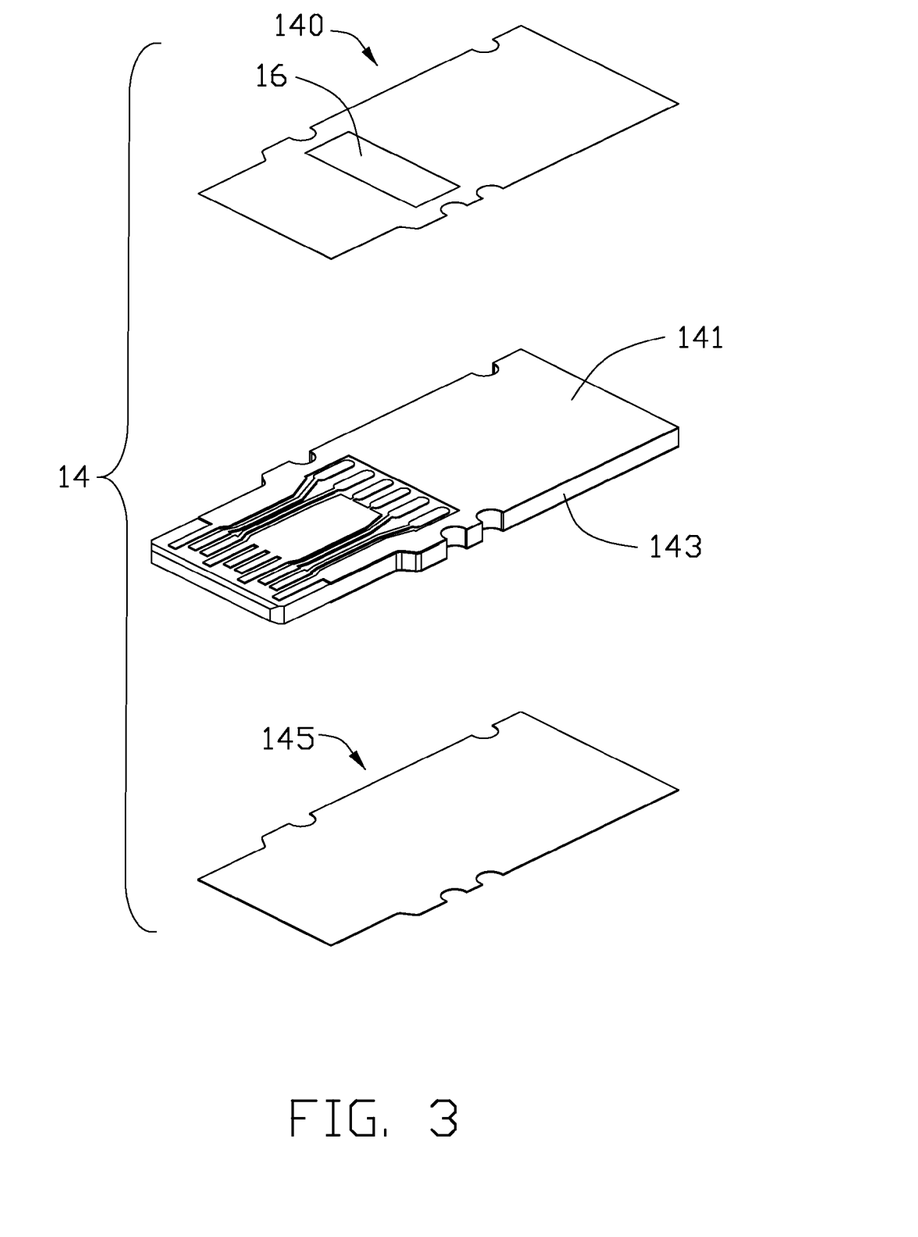
FIG. 3 is an exploded view of the printed circuit board of the electrical connector assembly as shown in FIG. 2.
Figure 4:
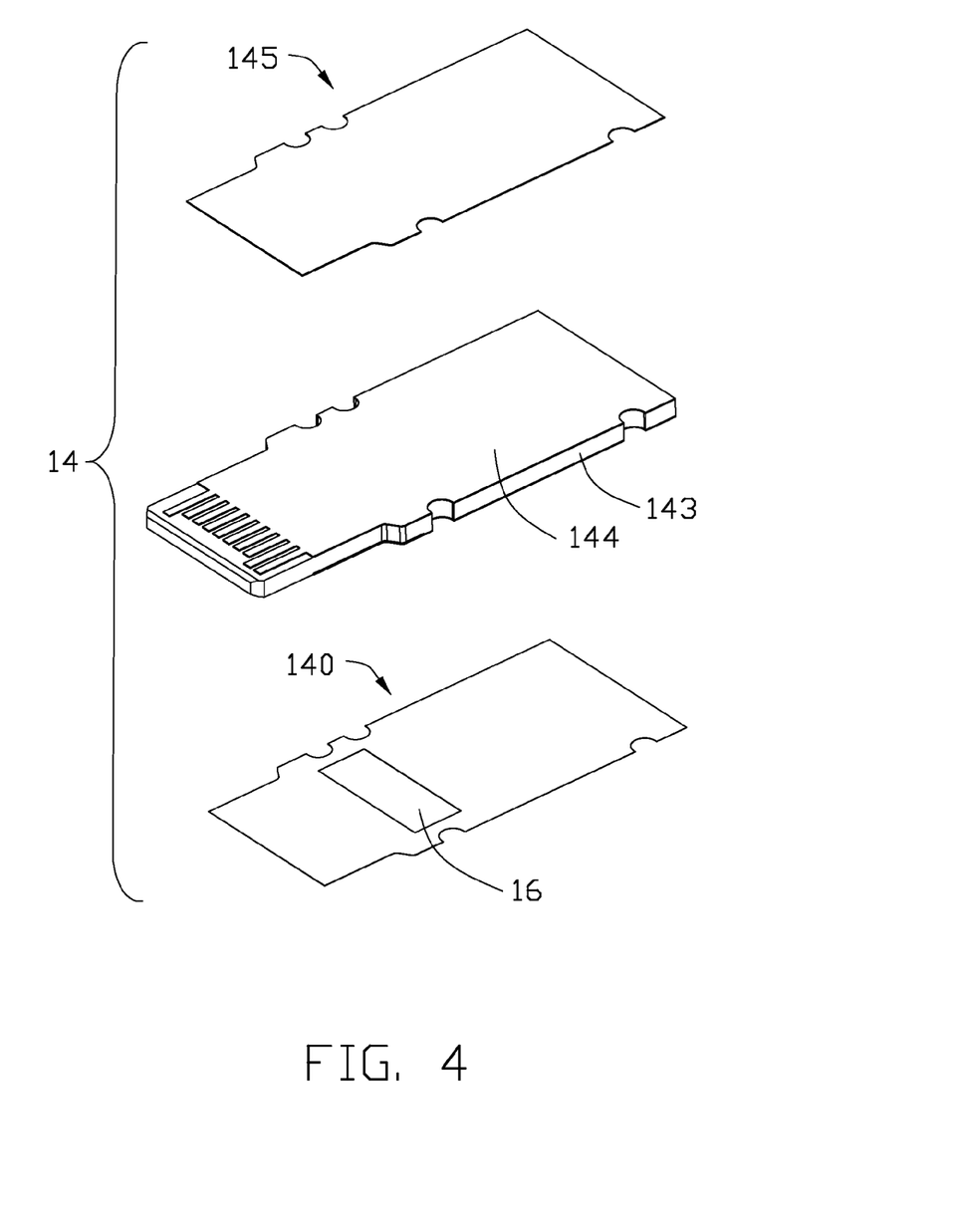
FIG. 4 is another exploded view of the printed circuit board as shown in FIG. 3.
Figure 5:
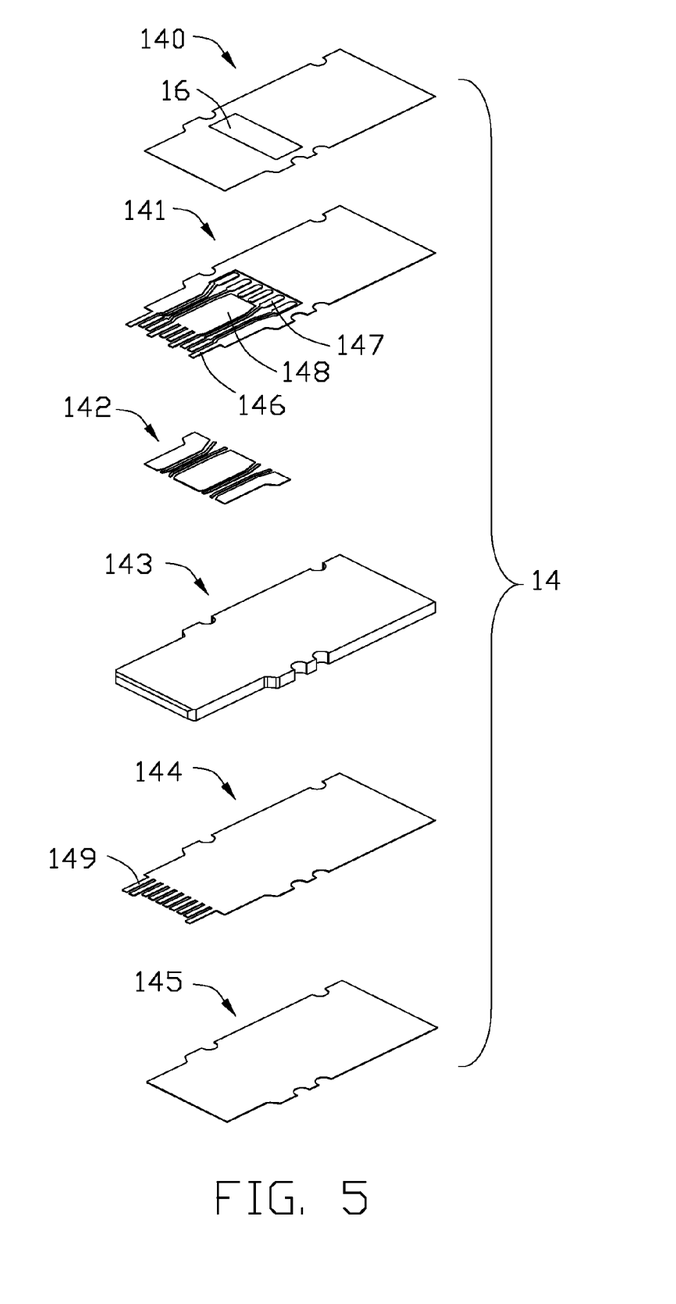
FIG. 5 is a further exploded view of the printed circuit board as shown in FIG. 4.
Figure 6:
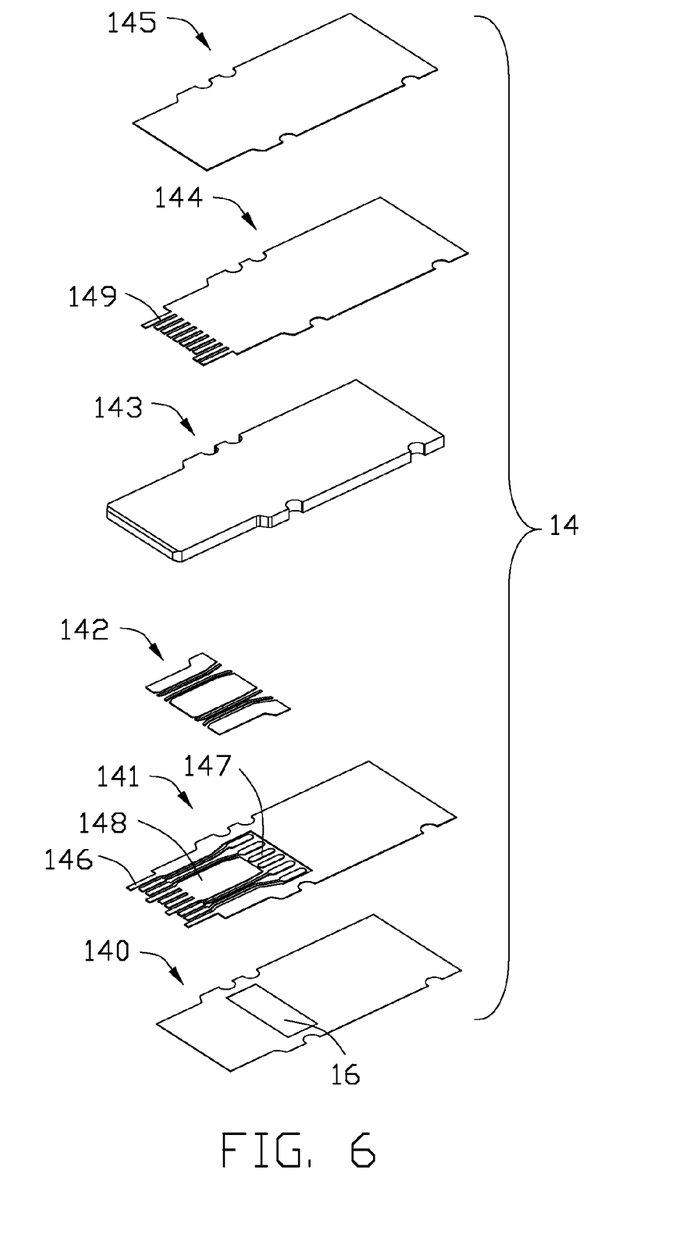
FIG. 6 is a further exploded view of the printed circuit board as shown in FIG. 5.

Referring to FIGS. 1-2 show an electrical connector assembly 10 comprising a metal shell, a printed circuit board 14 received in the metal shell, and a cable 15 connected with the printed circuit board 14. The metal shell comprises a first shell 11 and a second shell 12, the first shell 11 mounted to the second shell 12 along a top-to-bottom direction. The metal shell defines a cavity 13, the printed circuit board 14 received in the cavity 13. The metal shell has a front face and a rear face. The metal shell defines a front mating port in the front face and a rear mating port in the rear face. The front mating port is used for being mated with a mating connector. The rear mating port is used for being mated with the cable 15.

Referring to FIGS. 3-6 show the printed circuit board 14 comprising a first insulative layer 140, a first conductive path 141, a second conductive path 142, an insulative substrate 143, a third conductive path 144, and a second insulative layer 145 stacked together along the top-to-bottom direction. The first conductive path 141 comprises a first engaging portion 146, a middle portion having an end connected with the engaging portion, and a soldering portion connected with an opposite side of the middle portion, the second conductive path 142 aligned with the middle portion 148 of the first conductive path 141 along a bottom-to-top direction. The first conductive path 141 is electrically connected with the second conductive path 142 by conductive glue or laser welding. The first engaging portion 146 is used for being mated with a mating terminal 20 of the mating connector. The soldering portion 147 is used for being soldered with a conductor 150 of the cable 15. The first insulative layer 140 defines a slot 16, the slot 16 aligned with the soldering portion 147 along the top-to-bottom direction, the soldering portion 147 extending through the slot 16 and soldered with the conductor 150 of the cable 15. The third conductive path 144 is mounted to the insulative substrate 143 along the bottom-to-top direction. The third conductive path 144 comprises a second engaging portion 149, and the second engaging portion 149 is used for being mated with the mating terminal. The second insulative layer 145 is mounted to the third conductive path 144 along the bottom-to-top direction.

Figure 7:
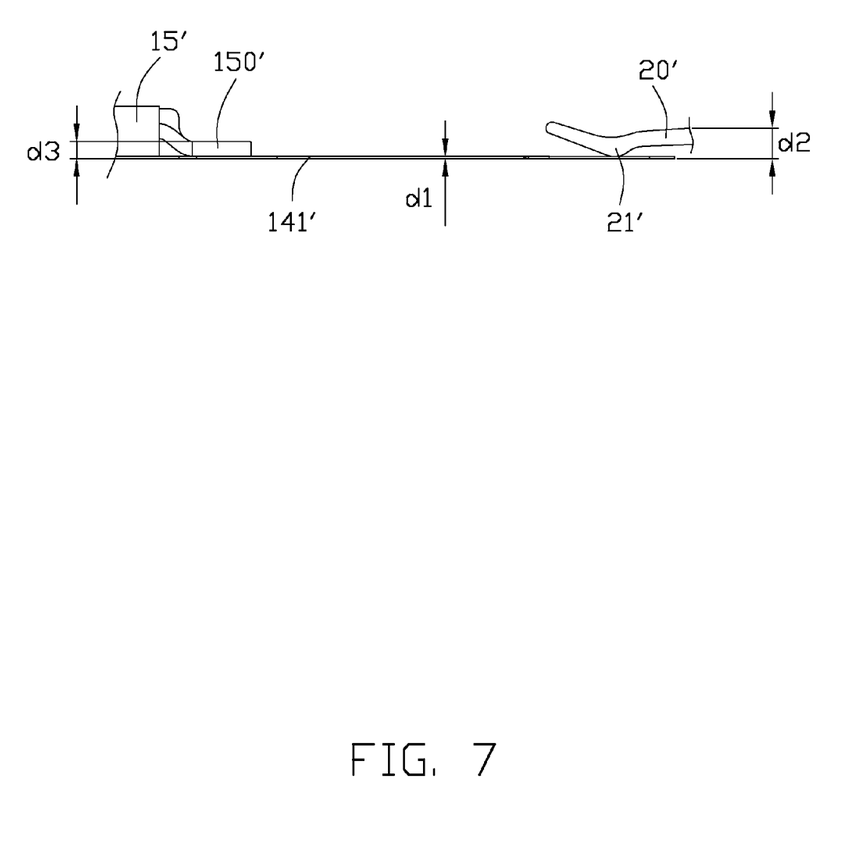
FIG. 7 is a schematic diagram of a conventional conductive path cooperating with the wire and the mating terminal in a prior art design.

Referring to FIG. 7 shows a first conductive path 141' of a printed circuit board being soldered with a conductor 150' of a cable 15' and being mated with a mating terminal of a mating connector according to prior art. When the printed circuit board is working, a first engaging portion of the first conductive path 141' will be mated with an engaging portion 21' of the mating terminal 20' and the soldering portion will be soldered with the conductor 150' of the cable 15'. The thickness of the first engaging portion along the top-to-bottom direction is d1 when the first engaging portion is not mated with the mating terminal 20'. The combined thickness of the first engaging portion and the mating terminal 20' along the top-to-bottom direction is d2 when the first engaging portion is mated with the engaging portion 21' of the mating terminal 20'. Said d2 is greater than said d1. The thickness of the soldering portion along a top-to-down direction is d1 when the soldering portion is not soldered with the conductor 150' of the cable 15'. The combined thickness of the soldering portion and the conductor 150' along a top-to-bottom direction is d3 when the soldering portion is soldered with the conductor 150' of the cable 15'. Said d3 is greater than said d1. The relationship between the characteristic impedance and a thickness of a conductor as follow:

$$Z_o = \left[120 \big/ (Er)^{\frac{1}{2}}\right] \times [\ln(2 \times S/d)]$$

$Z_o$ is the characteristic impedance, Er is the dielectric constant, S is a distance between adjacent conductors, and d is a thickness of a conductor.

As the above formula indicates, if an effective compensation of the characteristic impedance of a conductor can not be achieved by adjusting the dielectric constant or a distance between adjacent conductors, it might be achieved by merely adjusting a thickness of the conductor. When the other parameters are constants, the characteristic impedance will be inversely proportional to a thickness of the conductor. When the conductor has large variation in thickness along different portions thereof, the characteristic impedance of the printed circuit board will have an abrupt change and the transmission of signal will be unstable. So, when the printed circuit board is mated with the mating terminal of the mating connector and is soldered with the conductor of the cable in a prior art, the characteristic impedance of the printed circuit board will have an abrupt change. The characteristic impedance of the first engaging portion is smaller than the characteristic impedance of the middle portion, and the characteristic impedance of the soldering portion is smaller than the characteristic impedance of the middle portion.

Figure 8:
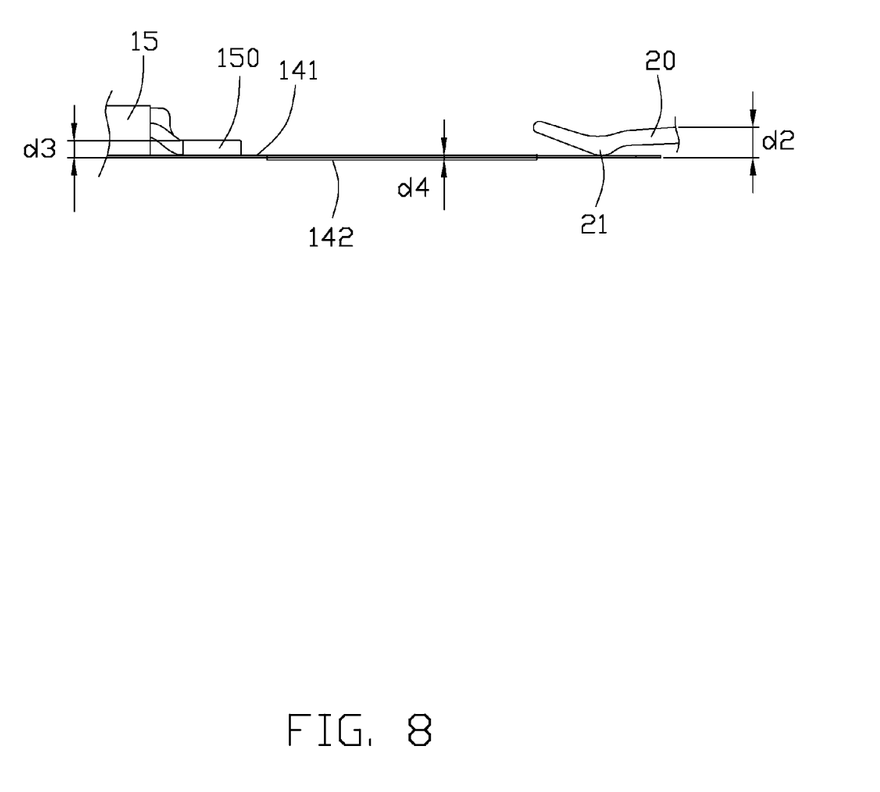
FIG. 8 is a schematic diagram of a conductive path of the present invention cooperating with the wire and the mating terminal.

FIG. 8 shows a first conductive path 141 of a printed circuit board 14 soldered with a conductor 150 of a cable 15 and mated with an engaging portion 21 of a mating terminal 20 in accordance with the present invention. A second conductive path 142 is disposed between the first insulative layer 140 and the insulative substrate 143, the second conductive path 142 aligned with a middle portion 148 of the first conductive path 141 along the bottom-to-top direction. When the printed circuit board 14 of an electrical connector assembly 10 is working, a first engaging portion 146 of the first conductive path 141 will be mated with the engaging portion 21 of the mating terminal 20 and a soldering portion 147 of the first conductive path 141 will be soldered with the conductor 150 of the cable 15. The thickness of the first engaging portion 146 along the top-to-bottom direction is d1 when the first engaging portion 146 is not mated with the engaging portion 21 of the mating terminal 20. The combined thickness of the first engaging portion 146 and the engaging portion 21 of the mating terminal 20 along the top-to-bottom direction is d2 when the first engaging portion 146 is mated with the engaging portion 21 of the mating terminal 20. Said d2 is greater than said d1. The thickness of the soldering portion 147 along the top-to-bottom direction is d1 when the soldering portion 147 is not soldered with the conductor 150 of the cable 15. The combined thickness of the soldering portion 147 and the conductor 150 along the top-to-bottom direction is d3 when the soldering portion 147 is soldered in the conductor 150 of the cable 15. Said d3 is greater than said d1. The thickness of the middle portion 148 of the first conductive path 141 along the top-to-bottom direction is d1. When the second conductive path 142 is aligned with the middle portion 148 of the first conductive path 141 along the bottom-to-top direction, the combined thickness of the middle portion 148 and the second conductive path 142 along the top-to-bottom direction is d4. Here, said d4 is closer to d2 than d1, and said d4 is closer to d3 than d1. This avoids characteristic impedance mismatch.

In contrast to the prior art, because the printed circuit board 14 comprises a second conductive path 142 disposed between the first insulative layer 140 and the insulative substrate 143, the second conductive path 142 aligned with the middle portion 148 of the first conductive path 141 along the bottom-to-top direction. Said d4 is closer to d2 than d1 and said d4 is closer to d3 than d1. This avoids characteristic impedance of the printed circuit board 14 from having an abrupt change when the printed circuit board 14 is working, and this also makes the transmission of the signal stable.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board comprising: a first insulative layer, a first conductive path, a second conductive path, and an insulative substrate stacked together, the first conductive path being disposed between the insulative substrate and the first insulative layer, the first conductive path comprising an engaging portion, a middle portion having an end connected with the engaging portion, and a soldering portion connected with an opposite end of the middle portion, the second conductive path aligned with the middle portion of the first conductive path along a vertical direction, the second conductive path being electrically connected with the middle portion of the first conductive path to define a combined thickness.

2. The printed circuit board as claimed in claim 1, wherein a thickness of the middle portion is greater than a thickness of the engaging portion, and the thickness of the middle portion is greater than a thickness of the soldering portion.

3. The printed circuit board as claimed in claim 2, wherein the second conductive path is disposed between the first conductive path and the insulative substrate.

4. The printed circuit board as claimed in claim 2, wherein the second conductive path is disposed between the first conductive path and the first insulative layer.

5. The printed circuit board as claimed in claim 1, wherein the first conductive path is electrically connected with the second conductive path by conductive glue.

6. The printed circuit board as claimed in claim 1, wherein the first conductive path is electrically connected with the second conductive path by laser welding.

7. The printed circuit board as claimed in claim 1, wherein the first insulative layer defines a slot to expose the soldering portion, the slot aligned with the soldering portion along the vertical direction.

8. The printed circuit board as claimed in claim 1, further comprising a second insulative layer and a third conductive path, the third conductive path disposed between the second insulative layer and the insulative substrate.

9. An electrical connector comprising:
a printed circuit board including an insulative substrate;
a first conductive layer applied upon the insulative substrate in a vertical direction, and including a plurality of first circuit paths thereof along a front-to-back direction perpendicular to said vertical direction, each of said circuit paths defining a front engaging portion for connecting with a conductive terminal, a rear soldering portion for soldering to a conductive wire, and a middle portion between the front engaging portion and a rear soldering portion in the front-to-back direction; and
a second conductive layer formed between the first conductive layer and the insulative substrate in the vertical direction and including a plurality of second circuit paths electrically connected to the middle portions of the corresponding first circuit paths, respectively, for lowering characteristic impedance thereabouts.

10. The electrical connector as claimed in claim 9, wherein the second circuit paths are aligned and intimately contacted with the middle portions of the corresponding first circuit paths in the vertical direction.

11. The electrical connector as claimed in claim 9, further including an insulative layer applied upon the first conductive layer while exposing the engaging portions and the soldering portions of the first circuit paths.

12. The electrical connector as claimed in claim 9, further including a third conductive layer applied upon the other side of the insulative substrate.

13. A printed circuit board comprising: an insulative substrate defining opposite surfaces in a vertical direction; a conductive layer applied upon one of said surfaces and including a plurality of circuit paths, each of said circuit path defining, along a front-to-back direction perpendicular to said front-to-back direction, a front engaging portion connecting with a conductive terminal, a rear soldering portion for soldering to a conductive wire, and a middle portion between the front engaging portion and the rear soldering portion in the front-to-back direction; wherein a thickness of the middle portion is larger than those of both the front engaging portion and said rear soldering portion in the vertical direction for lowering impedance thereabouts, wherein a larger thickness of the middle portion compared with those of the front engaging portion and the rear soldering portion is derived from an additional conductive layer including a plurality of another circuit paths intimately contacting the corresponding circuit paths in the vertical direction, respectively.

* * * * *